(12) United States Patent
Bao et al.

(10) Patent No.: US 11,063,598 B1
(45) Date of Patent: Jul. 13, 2021

(54) PHASE-LOCKED LOOP WITH A SAMPLING CIRCUIT

(71) Applicant: Himax Imaging Limited, Tainan (TW)

(72) Inventors: Xufeng Bao, Tainan (TW); Hack Soo Oh, Tainan (TW); Youngchul Sohn, Tainan (TW); Amit Mittra, Tainan (TW)

(73) Assignee: Himax Imaging Limited, Tainan (TW)

( * ) Notice: Subject to any disclaimer, the term of this patent is extended or adjusted under 35 U.S.C. 154(b) by 0 days.

(21) Appl. No.: 17/072,671

(22) Filed: Oct. 16, 2020

(51) Int. Cl.
*H03L 7/099* (2006.01)
*H03L 7/10* (2006.01)
*H03L 7/089* (2006.01)

(52) U.S. Cl.
CPC ............ *H03L 7/099* (2013.01); *H03L 7/0891* (2013.01); *H03L 7/10* (2013.01)

(58) Field of Classification Search
CPC ......... H03L 7/085; H03L 7/087; H03L 7/089; H03L 7/0891; H03L 7/091; H03L 7/099; H03L 7/10; H03L 7/101; H03L 7/102; H03L 7/103; H03L 7/104; H03L 7/105; H03L 7/107; H03L 7/1075
See application file for complete search history.

(56) References Cited

U.S. PATENT DOCUMENTS

| | | | |
|---|---|---|---|
| 5,379,302 A * | 1/1995 | Andrews | ........ G01R 31/318575 324/762.02 |
| 2011/0148485 A1* | 6/2011 | Cho | ........................ H03L 7/099 327/157 |

* cited by examiner

*Primary Examiner* — Diana J. Cheng
(74) *Attorney, Agent, or Firm* — Donald E. Stout; Stout, Uxa & Buyan, LLP

(57) ABSTRACT

A phase-locked loop (PLL) includes a voltage-controlled oscillator (VCO) that generates a PLL output signal having an oscillation frequency controlled by a control signal; a phase detector that generates a phase signal representing a difference in phase between the PLL output signal and a reference signal; a loop filter coupled to receive the phase signal; a switch; and a sampling circuit switchably coupled to receive the control signal of the VCO via the switch, and generating a code representing the control signal.

10 Claims, 3 Drawing Sheets

PHASE-LOCKED LOOP WITH A SAMPLING CIRCUIT

BACKGROUND OF THE INVENTION

1. Field of the Invention

The present invention generally relates to a phase-locked loop, and more particularly to a phase-locked loop capable of quickly phase locking.

2. Description of Related Art

A phase-locked loop (PLL) is a control system that generates an output signal whose phase is related to the phase of an input signal. After a period of time, the PLL may lock the phase of the output signal and the input signal.

The PLL may be widely employed in a variety of applications. For example, in a power-limited (e.g., battery-powered) surveillance application that adopts ultra-low power sensor design, the conventional PLL cannot be phase locked fast enough to save power. Moreover, the conventional PLL is designed to be always on, while the power-limited surveillance application is on, for example, only when motion is detected. Therefore, the conventional always-on PLL wastes precious power in the power-limited surveillance application.

A need has thus arisen to propose a novel scheme to overcome drawbacks of the conventional PLL.

SUMMARY OF THE INVENTION

In view of the foregoing, it is an object of the embodiment of the present invention to provide a phase-locked loop (PLL) capable of being disabled and quickly enabled properly to save power.

According to one embodiment, a phase-locked loop (PLL) includes a voltage-controlled oscillator (VCO), a phase detector, a loop filter, a switch and a sampling circuit. The VCO generates a PLL output signal having an oscillation frequency controlled by a control signal. The phase detector generates a phase signal representing a difference in phase between the PLL output signal and a reference signal. The loop filter is coupled to receive the phase signal. The sampling circuit is switchably coupled to receive the control signal of the VCO via the switch, and generates a code representing the control signal.

DETAILED DESCRIPTION OF THE INVENTION

Figure 1:
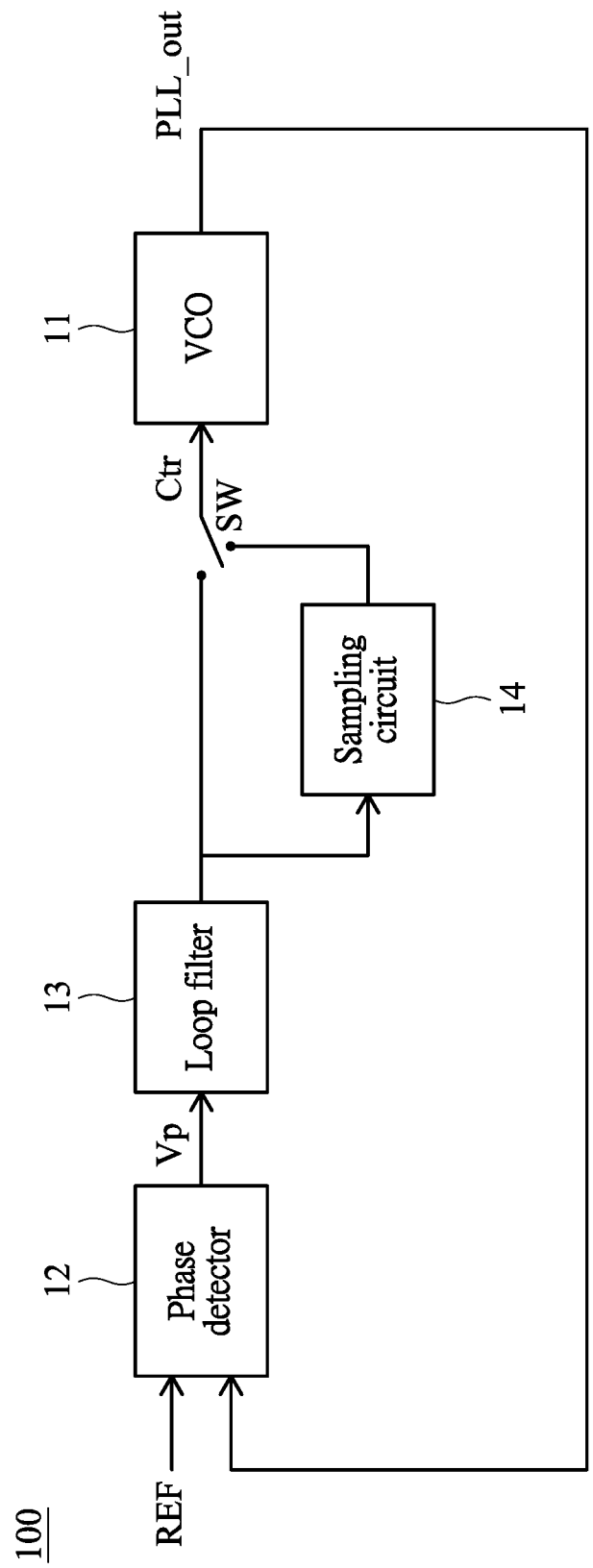
FIG. 1 shows a block diagram illustrating a phase-locked loop (PLL) according to one embodiment of the present invention.

FIG. 1 shows a block diagram illustrating a phase-locked loop (PLL) 100 according to one embodiment of the present invention. Specifically, the PLL 100 of the embodiment may include a voltage-controlled oscillator (VCO) 11 configured to generate a PLL output signal PLL_out having an oscillation frequency controlled by a control signal Ctr. The PLL 100 may include a phase detector 12 configured to generate a phase signal Vp which represents a difference in phase between the PLL output signal PLL_out and a reference signal REF. The PLL 100 may include a loop filter 13 (e.g., low-pass filter) operatively coupled to receive the phase signal Vp of the phase detector 12.

According to one aspect of the embodiment, the PLL 100 may include a sampling circuit 14 switchably coupled to receive the control signal Ctr of the VCO 11 via a switch SW, and configured to generate a code representing the control signal Ctr. Specifically, in the embodiment, the switch SW (e.g., single-pole double-throw switch) has a first terminal operatively connected to VCO's input node (i.e., the control signal Ctr), which is either switchably connected to an output node of the loop filter 13 directly (via a second terminal) or to an output node of the sampling circuit 14 (via a third terminal).

Figure 2:
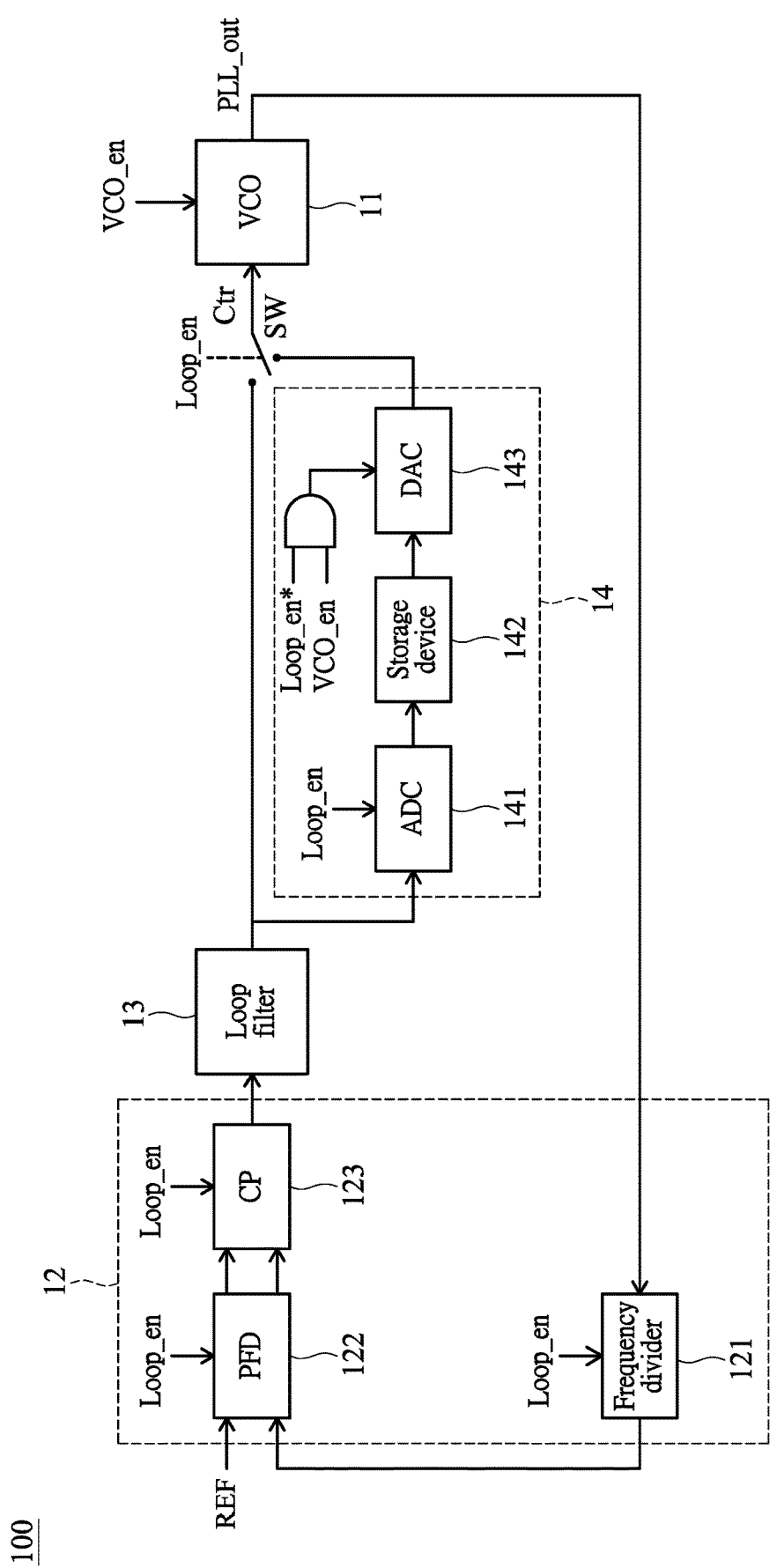
FIG. 2 shows a detailed block diagram illustrating the PLL of FIG. 1 according to one exemplary embodiment of the present invention.

FIG. 2 shows a detailed block diagram illustrating the PLL 100 of FIG. 1 according to one exemplary embodiment of the present invention. In the embodiment, the phase detector 12 may include a frequency divider 121 configured to divide a frequency of the PLL output signal PLL_out, thereby generating a divided signal. The phase detector 12 may include a phase-frequency detector (PFD) 122 operatively coupled to receive (and determine a phase difference between) the reference signal REF and the divided signal (from the frequency divider 121). The phase detector 12 may include a charge pump (CP) 123, which acts as a bipolar switched current source capable of outputting positive and negative current pulses into the loop filter 13.

In the embodiment, the sampling circuit 14 may include an analog-to-digital converter (ADC) 141 switchably coupled to receive the control signal Ctr (of the VCO 11) and configured to convert the (analog) control signal Ctr into a digital code. The sampling circuit 14 may include a storage device 142 configured to store the digital code (from the ADC 141). In one embodiment, the storage device 142 may include a latch (or flip-flop) such as S-latch. The sampling circuit 14 may include a digital-to-analog converter (DAC) 143 configured to convert the digital code (stored in the storage device 142) into a sampled control signal, which may be switchably provided to the VCO 11 via the switch SW.

According to one aspect of the embodiment, as shown in FIG. 2, the phase detector 12 (i.e., the frequency divider 121, the PFD 122 and the CP 123) and the ADC 141 may be enabled (i.e., turn on) by an asserted (e.g., "1") first enable signal Loop_en, the VCO 11 may be enabled (i.e., turn on) by an asserted (e.g., "1") second enable signal VCO_en, and the DAC 143 may be enabled (i.e., turn on) when an inverted first enable signal Loop_en* and the second enable signal VCO_en are both asserted (e.g., "1"). The switch SW may connect the VCO 11 to the output node of the loop filter 13 directly, but disconnect the DAC 143 when the first enable signal Loop_en is asserted. Alternatively, the switch SW may connect VCO 11 to an output node of the DAC 143, but disconnect the loop filter 13 when the first enable signal Loop_en is de-asserted (e.g., "0").

Figure 3:
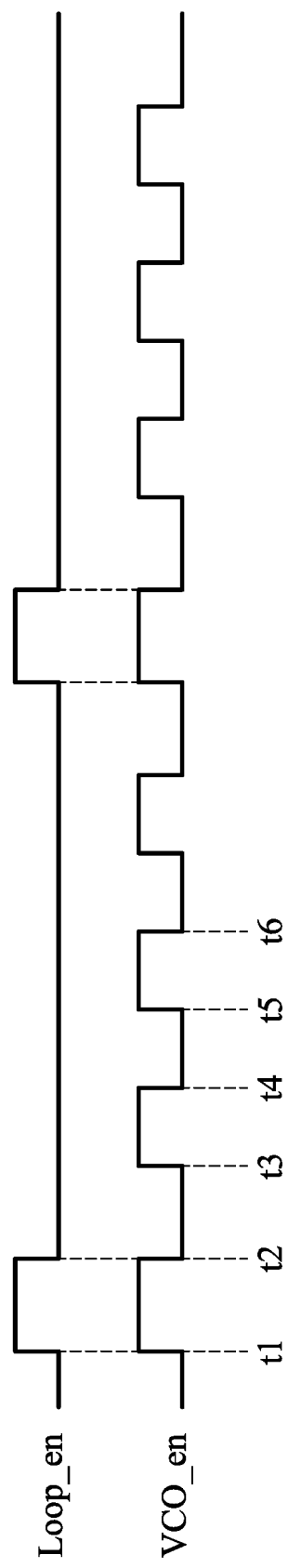
FIG. 3 shows exemplary timing diagrams illustrating the first enable signal and the second enable signal.

FIG. 3 shows exemplary timing diagrams illustrating the first enable signal Loop-en and the second enable signal VCO_en. In the operation of the PLL 100, when the first enable signal Loop_en is asserted (e.g., "1"), the switch SW may connect the VCO 11 to the output node of the loop filter 13 directly. At the same time, the phase detector 12 and the ADC 141 are turned on, and the DAC 143 is turned off.

When both the first enable signal Loop_en and the second enable signal VCO_en are asserted (e.g., "1"), for example, during t1-t2, the PLL 100 performs phase locking to eventually generate a PLL output signal PLL-out with a stable frequency after a period of time. At this time, the ADC 141 may convert the (analog) control signal Ctr into a digital code, which may then be stored in the storage device 142.

When the first enable signal Loop_en becomes de-asserted (e.g., "0"), for example, during t2-t3 or during t3-t4, the switch SW may connect VCO 11 to the output node of the DAC 143. At the same time, the ADC 141 and the phase detector 12 are turned off.

When the first enable signal Loop_en and the second enable signal VCO_en are both de-asserted, for example, during t2-t3, the phase detector 12, the ADC 141, the DAC 143 and the VCO 11 are turned off.

When the first enable signal Loop_en is de-asserted and the second enable signal VCO_en is asserted, for example, during t3-t4, the VCO 11 and the DAC 143 are turned on. Specifically, the DAC 143 may provide the sampled control signal to the VCO 11, which may quickly generate a PLL output signal PLL_out having a stable frequency as before, for example, at t2.

According to the embodiment as disclosed above, the entire PLL 100 may perform phase locking only during a period of time (e.g., t1-t2), in which the digital code (converted by the ADC 141) equivalent to the control signal Ctr may be stored (in the storage device 142). After that, the PLL 100 may be turned off. When the clock is needed (e.g., t5-t6), only the VCO 11 and the DAC 143 need be turned on to quickly obtain the PLL output signal PLL_out.

Although specific embodiments have been illustrated and described, it will be appreciated by those skilled in the art that various modifications may be made without departing from the scope of the present invention, which is intended to be limited solely by the appended claims.

What is claimed is:

1. A phase-locked loop (PLL), comprising:
a voltage-controlled oscillator (VCO) that generates a PLL output signal having an oscillation frequency controlled by a control signal;
a phase detector that generates a phase signal representing a difference in phase between the PLL output signal and a reference signal;
a loop filter coupled to receive the phase signal;
a switch; and
a sampling circuit switchably coupled to receive the control signal of the VCO via the switch, and generating a code representing the control signal;
wherein the sampling circuit comprises:
an analog-to-digital converter (ADC) switchably coupled to receive the control signal and converting the control signal of analog format into the code of digital format;
a storage device that stores the code of digital format; and
a digital-to-analog converter (DAC) that converts the code of digital format into a sampled control signal, which is switchably provided to the VCO via the switch;
wherein the phase detector and the ADC are enabled by an asserted first enable signal, the VCO is enabled by an asserted second enable signal, and the DAC is enabled when the second enable signal and an inverted first enable signal are both asserted.

2. The PLL of claim 1, wherein the loop filter comprises a low-pass filter.

3. The PLL of claim 1, wherein the switch has a first terminal connected to an input node of the VCO, a second terminal via which the input node of the VCO is switchably connected to an output node of the loop filter directly, and a third terminal via which the input node of the VCO is switchably connected to an output node of the sampling circuit.

4. The PLL of claim 1, wherein the phase detector comprises:
a frequency divider that divides a frequency of the PLL output signal, thereby generating a divided signal; and
a phase-frequency detector coupled to receive and determine a phase difference between the reference signal and the divided signal.

5. The PLL of claim 4, wherein the phase detector further comprises:
a charge pump that outputs positive and negative current pulses into the loop filter.

6. The PLL of claim 1, wherein the storage device comprises an S-latch.

7. The PLL of claim 1, wherein the switch connects the VCO to an output node of the loop filter directly but disconnects the DAC when the first enable signal is asserted, and the switch connects the VCO to an output node of the DAC but disconnects the loop filter when the first enable signal is de-asserted.

8. The PLL of claim 1, wherein when both the first enable signal and the second enable signal are asserted, phase locking is performed to eventually generate the PLL output signal with a stable frequency, and the ADC converts the control signal of analog format into the code of digital format, which is then stored in the storage device.

9. The PLL of claim 1, wherein when the first enable signal and the second enable signal are both de-asserted, the phase detector, the ADC, the DAC and the VCO are turned off.

10. The PLL of claim 1, wherein when the first enable signal is de-asserted and the second enable signal is asserted, the DAC provides the sampled control signal to the VCO, which generates the PLL output signal having a stable frequency.

* * * * *